(12) United States Patent
Mercier et al.

(10) Patent No.: US 10,877,439 B2
(45) Date of Patent: Dec. 29, 2020

(54) NEAR ZERO POWER CHARGING TO DIGITAL CONVERTER, SENSORS AND SENSING METHODS

(71) Applicant: The Regents of the University of California, Oakland, CA (US)

(72) Inventors: Patrick Mercier, San Diego, CA (US); Hui Wang, La Jolla, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 0 days.

(21) Appl. No.: 16/613,383

(22) PCT Filed: May 22, 2018

(86) PCT No.: PCT/US2018/033897
§ 371 (c)(1),
(2) Date: Nov. 13, 2019

(87) PCT Pub. No.: WO2018/217754
PCT Pub. Date: Nov. 29, 2018

(65) Prior Publication Data
US 2020/0117147 A1 Apr. 16, 2020

Related U.S. Application Data

(60) Provisional application No. 62/510,830, filed on May 25, 2017.

(51) Int. Cl.
*G04F 10/00* (2006.01)
*H03M 1/46* (2006.01)
(Continued)

(52) U.S. Cl.
CPC ............ *G04F 10/005* (2013.01); *H03M 1/46* (2013.01); *H03M 1/50* (2013.01); *H02J 7/007* (2013.01)

(58) Field of Classification Search
CPC ......... G04F 10/005; H03M 1/46; H03M 1/50; H02J 7/007
(Continued)

(56) References Cited

U.S. PATENT DOCUMENTS 9,146,162 B2 * 9/2015 Xu ........................ G01K 13/00
2002/0067303 A1 6/2002 Lee et al.
(Continued)

OTHER PUBLICATIONS

Azcona et al., "Precision CMOS Current Reference with Process and Temperature Compensation", 2014, pp. 910-913, IEEE, downloaded Jul. 27, 2020 from IEEE Xplore.
(Continued)

*Primary Examiner* — Khai M Nguyen
(74) *Attorney, Agent, or Firm* — Greer, Burns & Crain, Ltd.; Steven P. Fallon

(57) ABSTRACT

A charging to digital converter sensor in a CMOS integrated circuit includes a sensor responding to a sensed property, a converter that converts the sensed property into a charging time, a digitizer for digitizing the charging time, and digital feedback to reset the converter to restart the charging time. Preferred methods for sensing match the rising time of the first ramp voltage to a second ramp voltage generated by a reference current mirrored from a common current generator via the tuning of DAC capacitors driven by an LSB-first SAR logic feedback; or match rising times of the first and second ramp voltages to a reference voltage and providing a digital signal that translates the relationship of the first ramp voltage and the reference voltage to a digital quantification of the sensed property.

19 Claims, 10 Drawing Sheets

(51) Int. Cl.
*H03M 1/50* (2006.01)
*H02J 7/00* (2006.01)

(58) Field of Classification Search
USPC .................................... 341/166, 169, 172
See application file for complete search history.

(56) References Cited

U.S. PATENT DOCUMENTS

| | | | |
|---|---|---|---|
| 2008/0272952 A1 | 11/2008 | Wood | |
| 2010/0073741 A1 | 3/2010 | Shigematsu et al. | |
| 2012/0314463 A1 | 12/2012 | Chen | |
| 2013/0062503 A1 | 3/2013 | Saito et al. | |
| 2013/0272341 A1* | 10/2013 | Lee ......................... | G01K 7/01 374/184 |

OTHER PUBLICATIONS

Camacho-Galeano et al., "A 2-nW 1.1-V Self-Biased Current Reference in CMOS Technology", IEEE Transactions on Circuits and Systems—II: Express Briefs, Feb. 2005, pp. 61-65, vol. 52, No. 2, IEEE.

Chin et al., "Microfluidics-based diagnostics of infectious diseases in the developing world", Nature Medicine Technical Reports, Aug. 2011, pp. 1015-1020, vol. 17, No. 8, Nature Medicine.

Gough et al., "Function of an Implanted Tissue Glucose Sensor for More than 1 Year in Animals", Science Translational Medicine, 2010, pp. 1-10, vol. 2, American Association for the Advancement of Science, Washington, DC.

Hagleitner et al., "Smart single-chip gas sensor microsystem", Nature, Letters to Nature, Nov. 15, 2001, pp. 293-296, vol. 414, Macmillan Magazines Ltd.

Hirose et al, "A Nano-Ampere Current Reference Circuit and its Temperature Dependence Control by using Temperature Characteristics of Carrier Mobilities", 2010, pp. 114-117, IEEE, downloaded Jul. 27, 2020 from IEEE Xplore.

Huang et al, "A CMOS Sub-1-V NanoPower Current and Voltage Reference with Leakage Compensation", 2010, pp. 4069-4072, IEEE, downloaded Jul. 27, 2020 from IEEE Xplore.

Jeong et al., "A Fully-Integrated 71 nW CMOS Temperature Sensor for Low Power Wireless Sensor Nodes", IEEE Journal of Solid-State Circuits, Aug. 2014, pp. 1682-1693, vol. 49, No. 8, IEEE.

Lee et al, "A 1.4-µW 24.9-ppm/° C. Current Reference With Process-Insensitive Temperature Compensation in 0.18- µm CMOS", IEEE Journal of Solid-State Circuits, Oct. 2012, pp. 2527-2533, vol. 47, No. 10, IEEE.

Mercier et al, "Energy extraction from the biologic battery in the inner ear", Nature Biotechnology, Letters, Dec. 2012, pp. 1240-1244, vol. 30, No. 12, Nature America, Inc.

Pertijs et al., "A CMOS Smart Temperature Sensor With a 3σ Inaccuracy of +/−0.1° C. From −55° C. to 125° C.", IEEE Journal of Solid-State Circuits, Dec. 2005, pp. 2805-2815, vol. 40, No. 12, IEEE.

Sackmann et al., "The present and future role of microfluidics in biomedical research", Nature, Review, Mar. 13, 2014, pp. 181-189, vol. 507, Macmillan Publishers Limited.

Sebastiano et al., "A 1.2-V 10-µW NPN-Based Temperature Sensor in 65-nm CMOS With an Inaccuracy of 0.2° C. (3σ) From −70° C. to 125° C.", IEEE Journal of Solid-State Circuits, Dec. 2010, pp. 2591-2601, vol. 45, No. 12, IEEE.

Seok et al, "A Portable 2-Transistor Picowatt Temperature-Compensated Voltage Reference Operating at 0.5 V", IEEE Journal of Solid-State Circuits, Oct. 2012, pp. 2534-2545, vol. 47, No. 10, IEEE.

Souri et al, "A 0.85V 600nW All-CMOS Temperature Sensor with an Inaccuracy of ±0.4° C. (3σ) from −40 to 125° C.", presented at 2014 IEEE International Solid-State Circuits Conference, Session 12—Sensors, MEMS, and Displays, IEEE, downloaded on Jul. 27, 2020, from IEEE Xplore.

Ueno et al., "A 1-µW 600-ppm/° C. Current Reference Circuit Consisting of Subthreshold CMOS Circuits", IEEE Transactions on Circuits and Systems—II: Express Briefs, Sep. 2010, pp. 681-685, vol. 57, No. 9, IEEE.

Ueno et al., "A 300 nW, 15 ppm/° C., 20 ppm/V CMOS Voltage Reference Circuit Consisting of Subthreshold MOSFETs", IEEE Journal of Solid-State Circuits, Jul. 2009, pp. 2047-2054, vol. 44, No. 7, IEEE.

Wang et al., "A 0.45-V, 14.6-nW CMOS Subthreshold Voltage Reference With No Resistors and No BJTs", IEEE Transactions on Circuits and Systems—II: Express Briefs, Jul. 2015, pp. 621-625, vol. 62, No. 7, IEEE.

Wang et al., "A 14.5 pW, 31 ppm/° C. Resistor-Less 5 pA Current Reference Employing A Self-Regulated Push-Pull Voltage Reference Generator", 2016, pp. 1290-1293, IEEE, downloaded on Jul. 27, 2020, from IEEE Xplore.

Wang et al., "A 420 fW Self-Regulated 3T Voltage Reference Generator Achieving 0.47%/V Line Regulation from 0.4-to-1.2 V", 2017, pp. 15-18, IEEE, downloaded on Jul. 27, 2020, from IEEE Xplore.

Yang et al., "A 0.6nJ −0.22/+0.19° C. Inaccuracy Temperature Sensor Using Exponential Subthreshold Oscillation Dependence", presented at 2017 IEEE International Solid-State Circuits Conference, Session 9—Sensors, IEEE, downloaded on Jul. 27, 2020, from IEEE Xplore.

International Search Report and Written Opinion from the corresponding International Patent Application No. PCT/US2018/033897, dated Jul. 21, 2018.

* cited by examiner

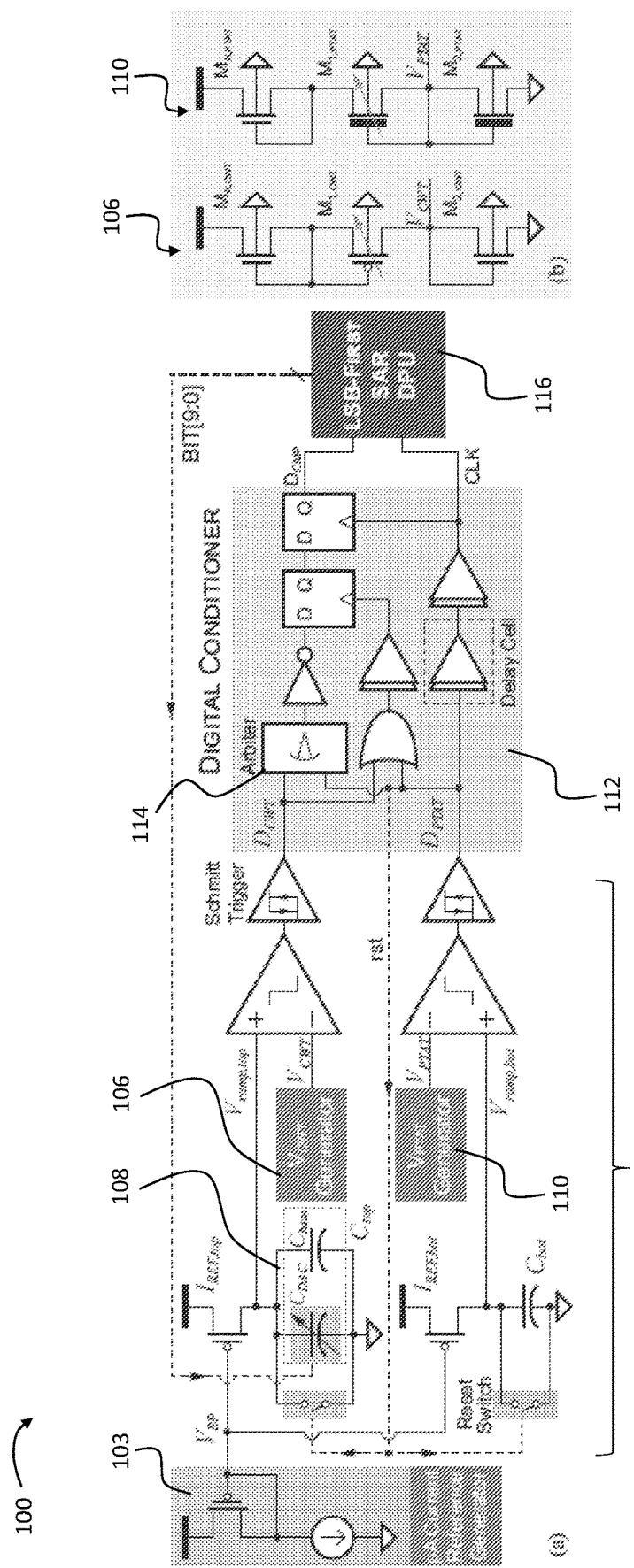

NEAR ZERO POWER CHARGING TO DIGITAL CONVERTER, SENSORS AND SENSING METHODS

PRIORITY CLAIM AND REFERENCE TO RELATED APPLICATION

This application is a 35 U.S.C. 371 US National Phase and claims priority under 35 U.S.C. § 119, 35 U.S.C. 365(b) and all applicable statutes and treaties from prior PCT Application PCT/US2018/033897, which was filed May 22, 2018, which application claimed priority from U.S. Provisional Application 62/510,830 which was filed May 25, 2017.

FIELD

A field of the invention is low power charging to digital conversion, sensors, e.g., temperature sensors, and sensing methods. Other fields of the invention include voltage reference generation and current reference generation. Example applications of the invention include circuits used in wireless systems, therapeutic devices, diagnostic devices, sensor devices, wearable devices, and research reagent applications.

BACKGROUND

Temperature measurement is important in applications including environmental monitoring, wearable biomedical devices, smart homes, and industrial internet-of-things equipment. Typical temperature sensing devices are designed to be small and/or unobtrusive. There is only a very small volume provided for a battery or energy harvesting source. Overall power available for such systems very limited to near zero power in order to support long system lifetime in a wide variety of applications. See, e.g., Mercier, P. P., Lysaght, A. C., Bandyopadhyay, S., Chandrakasan, A. P. & Stankovic, K. M., "Energy extraction from the biologic battery in the inner ear," *Nat. Biotechnol.* 30, 1240-1243 (2012); Sackmann, E. K., Fulton, A. L. & Beebe, D. J., "The present and future role of microfluidics in biomedical research," *Nature* 507, 181-189 (2014); Gough, D. A., Kumosa, L. S., Routh, T. L., Lin, J. T. & Lucisano, J. Y., "Function of an Implanted Tissue Glucose Sensor for More than 1 Year in Animals," *Sci. Transl. Med.* 2, 42ra53 (2010); Chin, C. D. et al., "Microfluidics-based diagnostics of infectious diseases in the developing world," *Nat. Med.* 17, 1015-1019 (2011); Hagleitner, C. et al,". Smart single-chip gas sensor microsystem," *Nature* 414, 293-296 (2001).

Accurate temperature sensors with such near zero power requirements are difficult to realize in practice. One prior approach involves measuring the temperature characteristics of bipolar junction transistors (BJT) integrated on silicon microchips. In such cases, temperature is transduced by comparing the proportional to absolute temperature (PTAT) characteristic of the difference between two base-emitter voltages of a vertical NPN BJT ($\Delta V_{BE}$) and the complementary to absolute temperature (CTAT) characteristic of the base-emitter voltage ($V_{BE}$), with a co-integrated constant with temperature (CWT) voltage reference. See, Pertijs, M. A. P., Makinwa, K. A. A. & Huijsing, J. H., "A CMOS smart temperature sensor with a 3σ inaccuracy of ±0.1° C. from −55° C. to 125° C.," *IEEE J. Solid-State Circuits* 40, 2805-2815 (2005); Sebastiano, F. et al. A 1.2-V 10-µW NPN-Based Temperature Sensor in 65-nm CMOS With an Inaccuracy of 0.2° C. (3σ) From −70° C. to 125° C. *IEEE J. Solid-State Circuits* 45, 2591-2601 (2010); Souri, K., Chae, Y. & Makinwa, K. A. A., "A CMOS Temperature Sensor With a Voltage-Calibrated Inaccuracy of ±0.15° C. (3σ) From −55° C. to 125° C. *IEEE," J. Solid-State Circuits* 48, 292-301 (2013). However, biasing BJTs in the forward-active region with sufficiently low noise properties usually demands currents in the nA-µA range that, coupled with supply voltages on the order of a few volts and the power overhead of biases, analog-to-digital conversion, and control, still exceeds the power demands of ultra-small sensing nodes.

Others have proposed further reductions in power consumption via a number of techniques, including exploiting the temperature-dependency of electron/hole mobility, threshold voltage, and drain currents of MOSFETs. MOSFETs can be fabricated to have different temperature dependencies, which provides the opportunity to sense temperature via techniques analagous to the BJT techniques discussed above. See, Hirose, T., Osaki, Y., Kuroki, N. & Numa, M., "A nano-ampere current reference circuit and its temperature dependence control by using temperature characteristics of carrier mobilities," 2010 *Proceedings of European Solid-State Circuits Conference* 114-117; doi: 10.1109/ESSCIRC.2010.5619819 (2010); Lee, J. & Cho, S. A, "1.4-µW 24.9-ppm/° C. Current Reference With Process-Insensitive Temperature Compensation in 0.18-µm CMOS" *IEEE J. Solid-State Circuits* 47, 2527-2533 (2012); Ueno, K., Hirose, T., Asai, T. & Amemiya, Y. A, "300 nW, 15 ppm/° C., 20 ppm/V CMOS Voltage Reference Circuit Consisting of Subthreshold MOSFETs," *IEEE J. Solid-State Circuits* 44, 2047-2054 (2009). One approach that borrows from the strategy used with BJTs involves connecting the gate, bulk and drain of a p-channel MOSFET together, to make the characteristic of the drain current with respect to the gate voltage approximate a pn-junction and thus detect temperature in a similar way to conventional BJT-based transducers. See, Souri, K., Chae, Y., Thus, F. & Makinwa, K., "12.7 A 0.85V 600 nW all-CMOS temperature sensor with an inaccuracy of ±0.4° C. (3σ) from −40 to 125° C.," 2014 *IEEE International Solid-State Circuits Conference* 222-223; doi: 10.1109/ISSCC.2014.6757409 (2014). Temperature-encoded analog signals (currents or voltages) can then be digitized by voltage-, current-, frequency-, or time-to-digital conversion. However, all prior-art MOSFET-based techniques still require at least tens of nW of power, and often require external CWT (constant with temperature) frequency sources for digitization that are not included in the quoted power number. Jeong, S. et al., "A Fully-Integrated 71 nW CMOS Temperature Sensor for Low Power Wireless Sensor Nodes,". *IEEE J. Solid-State Circuits* 49, 1682-1693 (2014); Yang, K. et al., "A 0.6 nJ−0.22/+0.19° C. inaccuracy temperature sensor using exponential subthreshold oscillation dependence," 2017 *IEEE International Solid-State Circuits Conference* 160-161; doi: 10.1109/ISSCC.2017.7870310 (2017).

Such MOSFET based sensing represents the state-of-the art approach. To the knowledge of the inventors, there are thus no current temperature sensing techniques that achieve the sub-nW power consumption necessary to enable next-generation near-zero-power sensing nodes.

Temperature sensor systems can leverage current reference circuits. A common fully-integrated current reference is based on a B multiplier. See, e.g., E. Camacho-Galeano et al., "A 2−nW 1.1-V self-biased current reference in CMOS technology," IEEE Transactions on Circuits and Systems II: Express Briefs, vol. 52, no. 2, pp. 61-65, (February 2005), which uses self-cascode MOSFETs (SCMs). Another approach exploits the different temperature characteristics of different carrier mobility to achieve nW power consumption and compact design, which comes, however, at the price of a high temperature coefficient. T. Hirose et al., "A nano-ampere current reference circuit and its temperature dependence control by using temperature characteristics of carrier mobilities," in 2010 Proceedings of ESSCIRC, pp. 114-117 (September 2010). An improved temperature coefficient is obtained by employing a modified multiplier that uses a MOS resistor. See, K. Ueno et al., "A 1-W 600-ppm/C Current Reference Circuit Consisting of Subthreshold CMOS Circuits," IEEE Transactions on Circuits and Systems II: Express Briefs, vol. 57, no. 9, pp. 681-685, (September 2010). However, the power consumption in that approach is still on the order of µW. Temperature coefficients on the order of 100 ppm/C are achieved by employing leakage compensation [Z. Huang et al., "A CMOS Sub-1-V nanopower current and voltage reference with leakage compensation," Proceedings of 2010 IEEE International Symposium on Circuits and Systems, pp. 4069-4072 (May 2010)] or by employing calibration [C. Azcona et al., "Precision CMOS current reference with process and temperature compensation," in 2014 IEEE International Symposium on Circuits and Systems (ISCAS), pp. 910-913 (June 2014)]. While leakage compensation and calibration can reduce power consumption to the desired nW level, typical circuits compensated in those ways can still exceed the power budget of near zero-power wireless platforms. In addition, the conventional current reference circuits require start-up circuits to prevent them from being trapped in the zero-bias condition, adding area and standby power overhead.

Another type of current reference circuit employs a reference voltage and a resistor. See, J. Lee and S. Cho, "A 1.4-W 24.9-ppm/C Current Reference With Process-Insensitive Temperature Compensation in 0.18-m CMOS," IEEE Journal of Solid-State Circuits, vol. 47, no. 10, pp. 2527-2533, (October 2012). This circuit was reported to achieve a temperature coefficient as low as 24.9 ppm/° C., but had high power consumption at the µW-level power. Another circuit that used a 2T voltage reference was reported to achieve pW power consumption, but at the expense of a significantly higher 780 ppm/° C. temperature sensitivity coefficient. Such prior conventional voltage reference based current generation circuits provide a trade-off between achieving either pW level power consumption or a suitable temperature coefficient.

Conventionally, temperature- and supply stabilized voltages are generated via bandgap voltage reference generators (VRGs). However, the lowest reported power of bandgap VRGs is tens of nW, which is too large for near-zero-power wireless application. See, Y. Wang et al., "A 0.45-V, 14.6-nW CMOS Subthreshold Voltage Reference With No Resistors and No BJTs," IEEE Transactions on Circuits and Systems II: Express Briefs, vol. 62, no. 7, pp. 621-625, (July 20150. Modification of such circuits with bandgap VRGs to achieve pA-level reference current would require resistors that are prohibitively large for a practical current generator.

Since bandgap VRGs are not suitable for sub nW applications, others have proposed 2T VRGs that consume pW-level power by exploiting the opposing temperature properties of native and high-Vth transistors. See, M. Seok et al., "A Portable 2-Transistor Picowatt Temperature-Compensated Voltage Reference Operating at 0.5 V," IEEE Journal of Solid-State Circuits, vol. 47, no. 10, pp. 2534-2545, (October 2012). However, not all CMOS technologies support native devices, limiting the availability of this approach in certain processes.

SUMMARY OF THE INVENTION

A preferred embodiment provides a charging to digital converter sensor in a CMOS integrated circuit that includes a sensor responding to a sensed property, a converter that converts the sensed property into a charging time, a digitizer for digitizing the charging time, and digital feedback to reset the converter to restart the charging time. Preferred methods for sensing match the rising time of the first ramp voltage to a second ramp voltage generated by a reference current mirrored from a common current generator via the tuning of DAC capacitors driven by an LSB-first SAR logic feedback; or match rising times of the first and second ramp voltages to a reference voltage and providing a digital signal that translates the relationship of the first ramp voltage and the reference voltage to a digital quantification of the sensed property.

BRIEF DESCRIPTION OF THE DRAWINGS

FIG. 1A is a schematic circuit diagram of a preferred embodiment temperature sensor including a preferred voltage to charging time converter sub-circuit; FIG. 1B includes circuit diagram of a preferred 3T constant with temperature (CWT) current voltage reference generator (VRG) and a preferred proportional with absolute temperature (PTAT) voltage reference generator for the FIG. 1A circuit.

FIG. 3 is a flow chart of the LSB-first SAR (least significant bit first successive approximation register) logic employed in the digital processing unit of FIG. 1A;

DESCRIPTION OF THE PREFERRED EMBODIMENTS

Figure 1C:
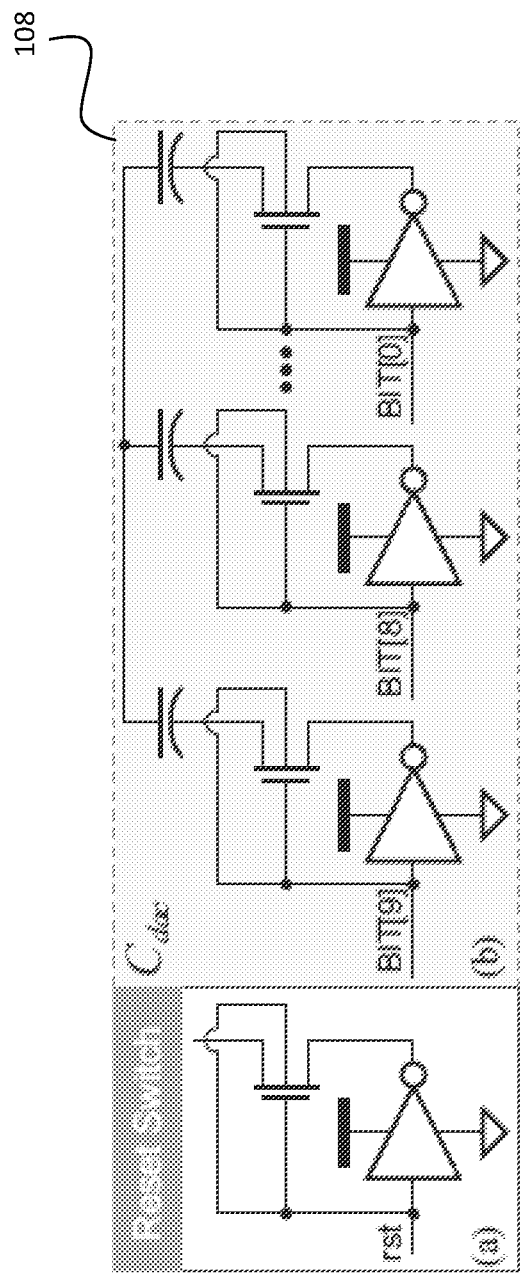
FIG. 1C includes circuit schematics for the reset switch and the digital to analog converter of FIG. 1A.

Preferred embodiment physical property sensors provide ultra-low-power sensing was via a charging-time to digital conversion instead of providing a current response to the sensed physical property, such as temperature, sound, light, etc. In a preferred embodiment, the output voltage of a proportional to absolute temperature (PTAT) voltage reference generator (VRG), or a proportional to sound, light or another property voltage reference generator, is compared to a ramp voltage generated by charging a MIM capacitor (or other types of accurate on-chip capacitors, e.g. a poly capacitor) with a mirrored constant with temperature (CWT) reference current and matched to the rising time to another ramp voltage generated by a reference current mirrored from generator common pA current reference generator via the tuning of DAC capacitors driven by an LSB-first SAR logic feedback, which can be designed to be very energy-efficient and fast. Low power and accurate temperature digitization are provided Experimental temperature sensing circuits, across eight 65 nm samples, revealed a maximum temperature error of ±1.38° C. across the temperature range from 0 to 100° C. after two-point calibration, which can be reduced to ±0.73° C. after three-point calibration, or +0.77° C./−0.41° C. after two point calibration with trimming, all with an average power consumption of 763 pW.

Preferred embodiments provide converters, sensing methods and sensors that demand near zero energy to operate. Example methods and temperature sensors of the invention have demonstrated a hundreds-fold improvement (e.g. 628×) over state-of-the art CMOS temperature sensors (compared to Jeong, S. et al. A Fully-Integrated 71 nW CMOS Temperature Sensor for Low Power Wireless Sensor Nodes. *IEEE J. Solid-State Circuits* 49, 1682-1693 (2014)). Preferred methods of the invention leverage complementary temperature dependencies of n- and p-type MOSFETs biased in the subthreshold region, together with CWT tunneling currents and a capacitive charging-time-to-digital feedback architecture that digitizes temperature in the pW range (e.g., at 113 pW) in a fully monolithically-integrated manner.

A preferred temperature sensor includes a 2-transistor (2T) or 3T subthreshold PTAT voltage reference generator (VRG) as the temperature sensing element, while another temperature-stabilized 2T or 3T subthreshold VRG serves as a CWT reference. To sense another property, the subthreshold PTAT is replaced by another reference generator, such as a photodiode that responds to radiation to provide a radiation/light sensing circuit. The 2T VRGs were developed by the inventors as part of a current reference circuit. See, Wang, H. & Mercier, P. P. A 14.5 pW, 31 ppm/° C. resistor-less 5 pA current reference employing a self-regulated push-pull voltage reference generator. in 2016 *IEEE International Symposium on Circuits and Systems* 1290-1293; doi: 10.1109/ISCAS.2016.7527484 (2016). The preferred 3T generator circuit is more supply stabilized compared to the 2T structure because a third transistor further isolates the 2T core from the voltage supply in the 3T circuit.

Preferred sensors do not require power-hungry band-gap VRGs, used in the prior art discussed in the background. Instead, preferred temperature sensors of the invention convert PTAT (proportional to absolute temperature) and CWT analog voltages to pA-level currents via self-biased current generators which employed effectively large resistors in small areas via tunneling currents. The effective resistance is inversely proportional to the gate area of the gate-leakage transistor. For example, in the experimental implementation the effective resistance is ~20 GΩ. The implementation used a 20 micrometer×50 micrometer leakage gate, which can provide 10 pA leakage current when biased at 0.2 V, or equivalently provide a resistance of ~20 GΩ. Temperature was then digitized by charging digitally-controllable monolithic MIM capacitors with the pA-level currents and matching the charging time between the PTAT and CWT paths via feedback-driven tuning of the MIM capacitors for direct ultra-low-power digital readout.

By combining the generation of CWT and PTAT voltages via subthreshold-biased 2T or 3T circuits with tunneling-current-based CWT resistances to generate CWT and PTAT currents, and using these currents in a feedback circuit that normalizes charging time via a digitally-controlled capacitor, temperature is directly digitized at ultra-low-power. With a relaxation oscillator intrinsically built into the present architecture, no external references, biases, clocks, or any other components are required for temperature-to-digital transduction. The present sensor enables a new class of devices that can monitor their environments with nearly zero power, enabling ultra-long battery life, or energy harvesting from low-power sources towards energy-autonomous operation.

Preferred embodiments of the invention will now be discussed with respect to the drawings and experiments used to demonstrate the invention. The drawings may include schematic representations, which will be understood by artisans in view of the general knowledge in the art and the description that follows. Features may be exaggerated in the drawings for emphasis, and features may not be to scale.

Figure 2B:
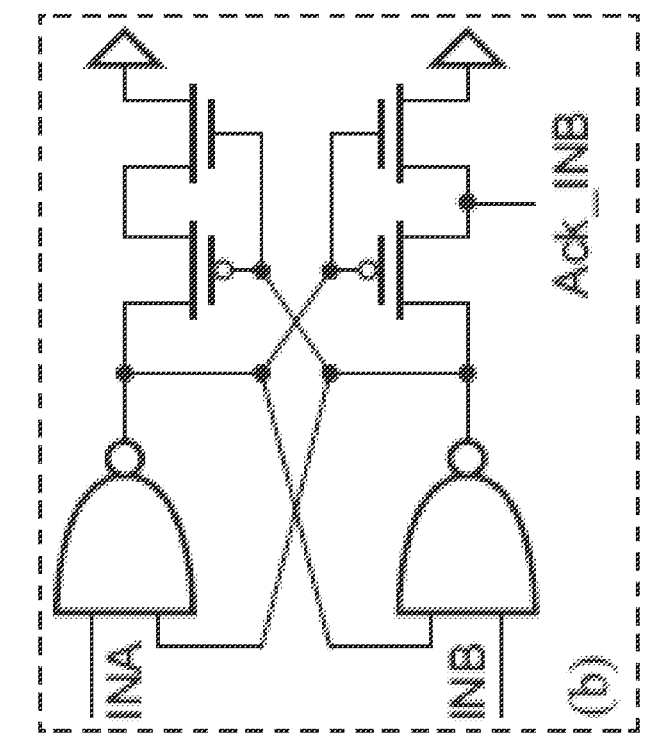
FIG. 2A is a circuit diagram of the pA-level current reference generator of FIG. 1A, and FIG. 2B a circuit diagram of the digital arbiter of FIG. 1A.
Figure 2A:
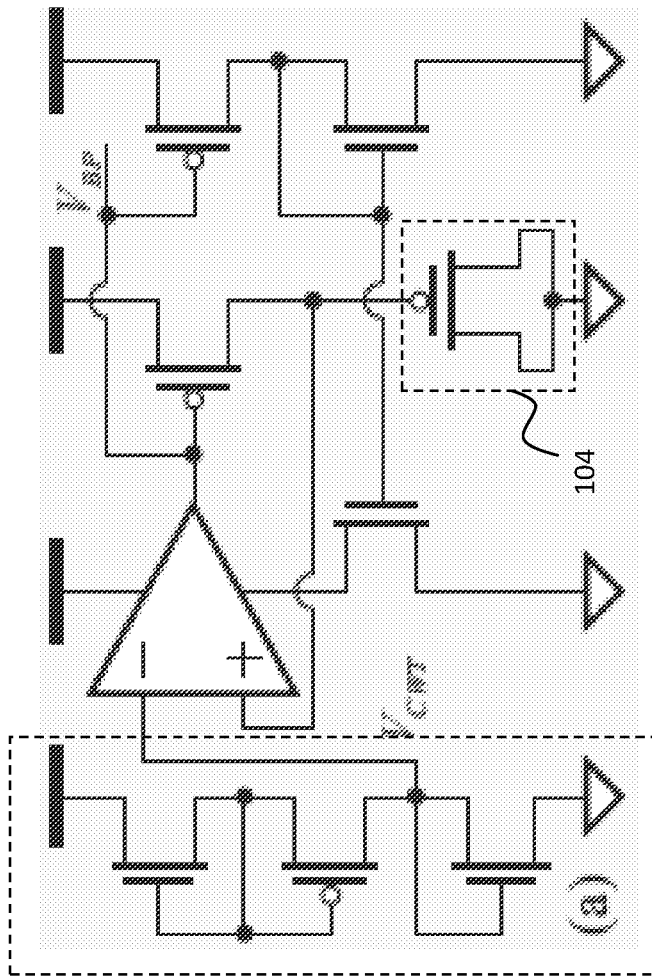

FIG. 1A illustrates a preferred embodiment fully integrated temperature sensor circuit 100 including a preferred voltage to charging time converter sub-circuit 102. A pA reference current generator 103 powers the sensor circuit 100. The sensor circuit, to reduce inaccuracy, uses a single CWT current reference, generated by biasing a gate-leakage device 104 (FIG. 2A) with a 3T CWT VRG 106 (FIG. 1B) via the feedback architecture in FIG. 2A. As shown in FIG. 2A, another Vcwt generator 106 is employed to generate Vcwt which is then buffered by an amplifer. Via negative feedback, the potential at the positive input of the amplifier is ideally equal to that at the negative input, i.e. Vcwt. Therefore, the gate of the gate-leakage transistor is biased at Vcwt, which is generated by 106. Returning to FIG. 1A, this current is mirrored to charge a fixed capacitor, $C_{bot}$ (with ramp voltage Vramp,bot), and a capacitive DAC 108 that creates $C_{top}$ (with ramp voltage Vramp,top). With this arrangement, any temperature-dependent current source non-linearities appear as common-mode and are rejected. Thus, instead of relying on temperature to modulate currents as in prior approaches, the ramp voltages of the two capacitors are directly compared to the output of the 3T CWT 106 and a PTAT VRG 110 ($V_{CWT}$ and $V_{PTAT}$, respectively), which effectively serve as the temperature transducer. A digital conditioner 112 with an arbiter 114 (detailed in FIG. 2B) determines which ramp crossed its respective threshold first, at which point the capacitors $C_{top}$ and $C_{bot}$ are reset, and, through a least significant bit first (LSB-first) digital processing unit 116, $C_{top}$ is digitally adjusted until the charging times are equalized in subsequent cycles when $C_{top}$ can be calculated by Eq 1:

$$C_{top} = \frac{V_{PTAT} I_{REF,top} C_{bot}}{V_{CWT} I_{REF,bot}}, \qquad (1)$$

where $I_{REF,top}$ and $IR_{EF,bot}$ are the currents mirrored from the pA-level current reference generator to charge $C_{top}$ and $C_{bot}$, respectively. Ignoring the higher order nonlinear components and thus assuming $V_{PTAT}$=kT+Vo for simplicity, where k is the temperature coefficient and Vo represents an offset, (1) can be rewritten as:

$$C_{top} = kT \frac{I_{REF,top} C_{bot}}{V_{CWT} I_{REF,bot}} ① + V_o \frac{I_{REF,top} C_{bot}}{V_{CWT} I_{REF,bot}} ②, \qquad (2)$$

where ① represents a proportional to temperature component and is a temperature independent offset term. With reference to FIG. 1A, $C_{top}$ is composed of $C_{DAC}$ and $C_{base}$. The value $C_{DAC}$ of the former is proportional to temperature (thus creating a direct 10b read-out), while the $C_{base}$ sets the temperature-to-code mapping range, representing ① and ② in Eq. (2), respectively.

The CWT and PTAT VRGs 106 and 110 are preferably constructed using 3T self-regulated structures [H. Wang and P. P. Mercier, "A 420 fW self-regulated 3T voltage reference generator achieving 0.47%/V line regulation from 0.4-to-1.2 V," in ESSCIRC 2017—43rd IEEE European Solid State Circuits Conference, September 2017, pp. 15-18.], with transistor M1 digitally tunable to combat nonidealities such as parasitic diode leakage and process variation for improved linearity and thus minimized temperature sensing error. Since all circuits in the preferred embodiment operate in the pA-regime, leakage across switches can become significant and deteriorate performance. To minimize leakage, dynamic threshold MOS transistors (DTMOS) are preferred with super cutoff control by employing an inverter 130 to set the source of NMOS switches at $V_{DD}$, and thus $V_{gs}$ of the switch is smaller than 0 during off-state as shown in FIG. 1C, effectively reducing the $R_{off}/R_{on}$ ratio by over 32× when VDD=0.5 V. Such switches are utilized to reset $C_{top}$ and $C_{bot}$ in FIG. 1A as well as a DAC 108, a detailed preferred circuit of which is shown in FIG. 1C, which improves its linearity by 5×.

Figure 3:
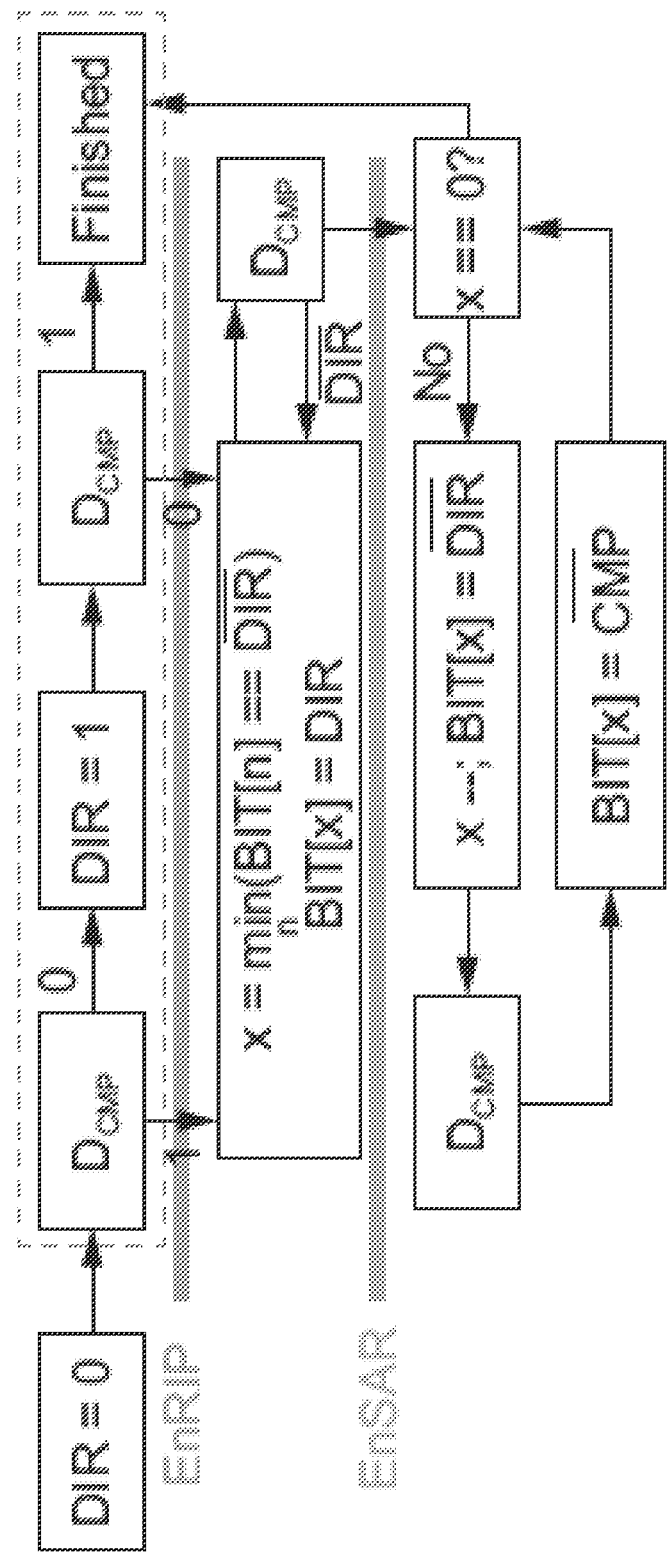
FIG. 3 is a diagram of the least significant bit first successive approximation register (LSB-SAR) logic of FIG. 1A.
Figure 4A:
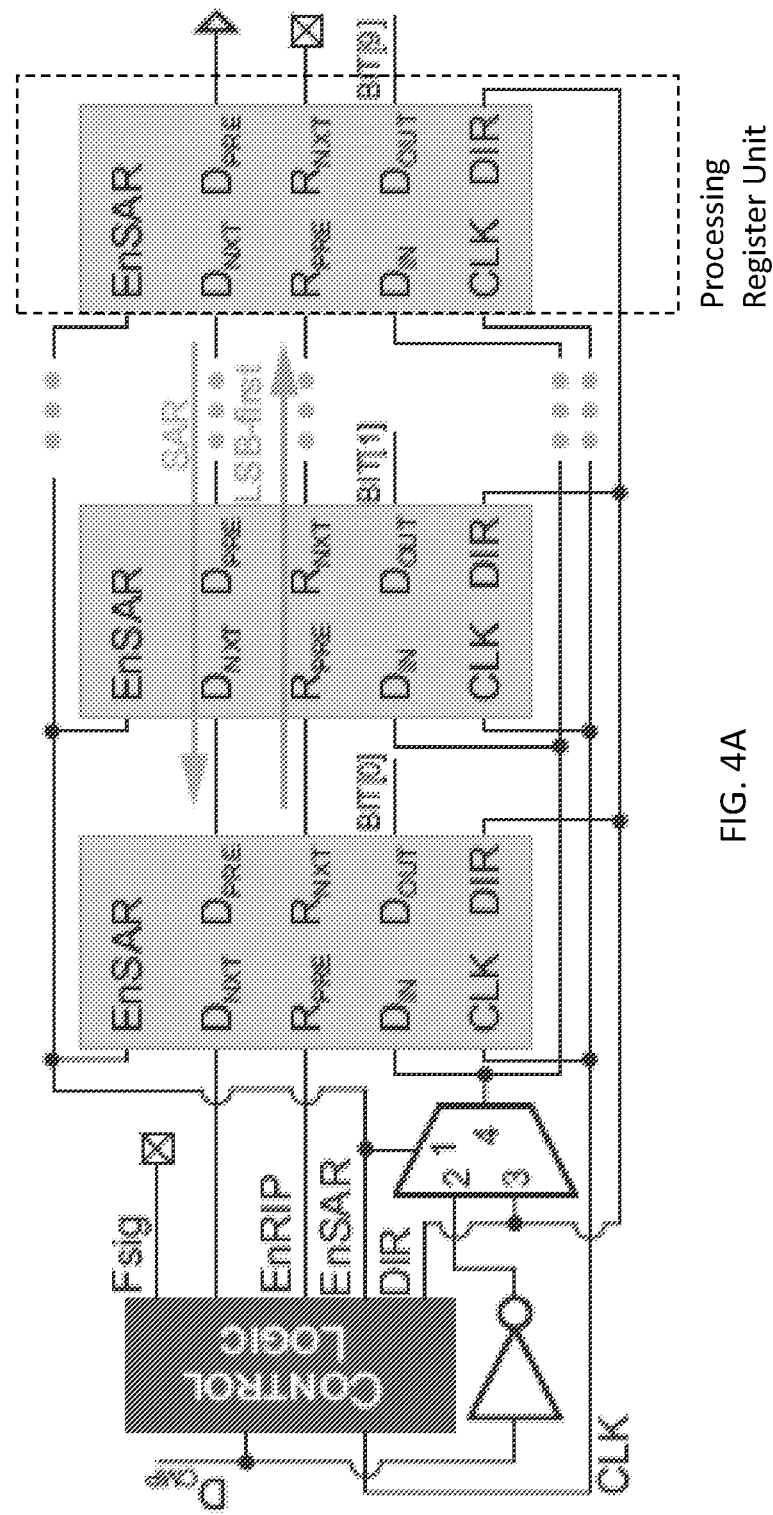
FIG. 4A is a preferred architecture for the LSB-first SAR of FIG. 3.
Figure 4B:
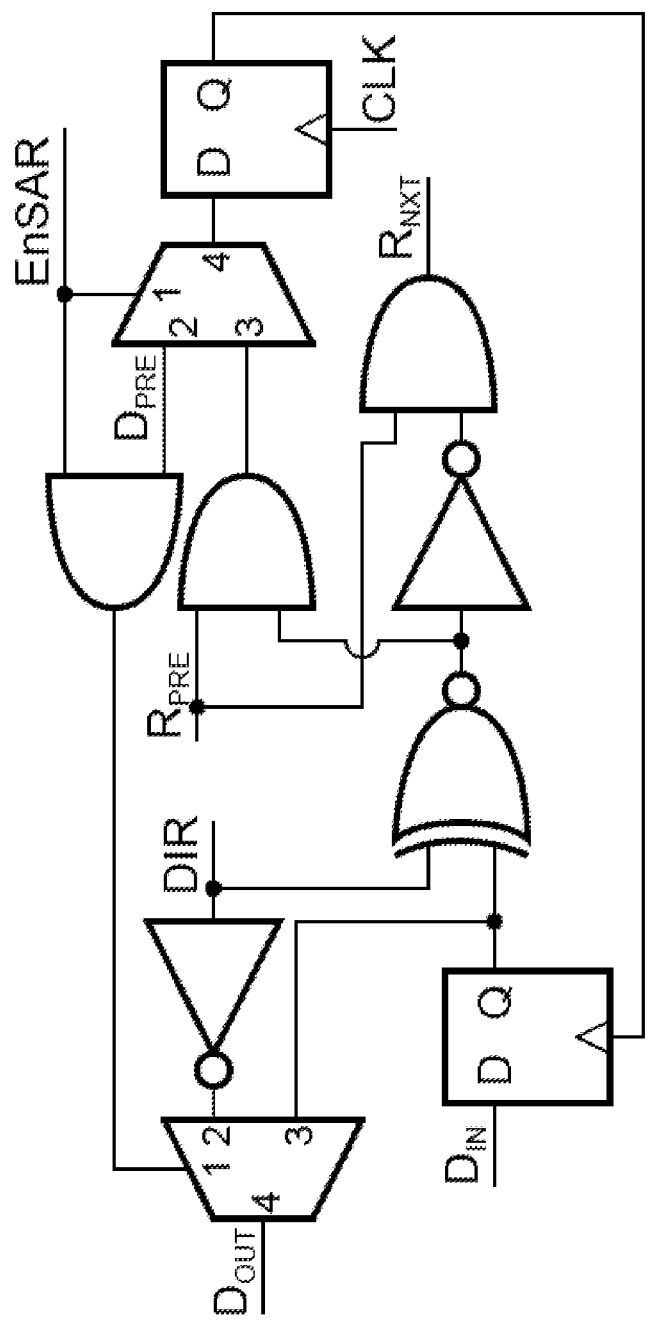
FIG. 4B shows details of the processing register unit of FIG. 4A.

FIG. 3 shows the flow chart of the LSB-first SAR logic employed in the DPU 116 to ensure fast temperature-to-digital conversion. Under small cycle-to-cycle temperature changes, the converter can settle in as little as a single clock cycle. At ambient room temperature, an average of 1.3 cycles are required. In the worst case, up to 20 clock cycles are required, which is over 51× faster than the linear-search algorithm employed in the FIGS. 5A and 5B embodiment. Except for the best-case single-cycle search, the LSB-first SAR algorithm operates in two phases. In phase 1, the bit that is not equal to DIR (the initial arbiter output) is set to DIR, with those equal to DIR skipped from LSB to MSB in each clock cycle until the output of the arbiter 114 flips. At this point, the logic enters phase 2, and a regular SAR algorithm is applied from the bit that introduces the output flipping of the arbiter to the LSB. A preferred architecture for the LSB-first digital processing unit (DPU) is shown in FIG. 4. Control logic of controller is deployed to transition the DPU 116 between the LSB to MSB phase and SAR phase based on the decision of the arbiter 114 in each clock cycle. $D_{CMP}$ in FIG. 3 is the comparator output signal. In FIG. 4, $D_{PRE}$ and $D_{NXT}$ are the input and output signals to the Processing Register Unit during phase 2 for SAR calculation, respectively. $R_{PRE}$ and $R_{NXT}$ are the input and output signals to the Processing Register Unit during phase 1 for the LSB first algorithm calculation, respectively. FIG. 4B is a schematic of the Processing Register Unit of FIG. 4A. $D_{IN}$ is the input to the Processing Register Unit for the calculation of output bit $D_{OUT}$.

An experimental temperature sensor consistent with FIGS. 1A-4 was implemented in 65 nm CMOS, occupying an area of 0.63 mm² Measurements from 8 samples revealed an average power of 763 pW at 20° C. when operating from 0.5 V supply, while consuming less than 70 nW across the temperature range from 0 to 100° C. After two-point calibration, a maximum temperature error of ±1.38° C. was observed across a 0 to 100° C. range, with no trimming applied, while a temperature error of ±0.73° C. was achieved with a three-point calibration across the same temperature range. With M1,$_{\{CWT,P\ TAT\}}$ trimming only (3 MSBs used), two-point calibrated sensing error reduced from +1.38° C./−1.35° C. to +0.77° C./−0.41° C. An average temperature resolution of 0.3° C. was obtained after 40 clock cycles (0.3 s), resulting in a conversion energy of 0.23 nJ/conversion, the lowest reported conversion energy of fully integrated sub-µW temperature sensors known to the present inventors, all with improved inaccuracy compared to prior sub-100 nW designs known to the inventors.

Figure 5A:
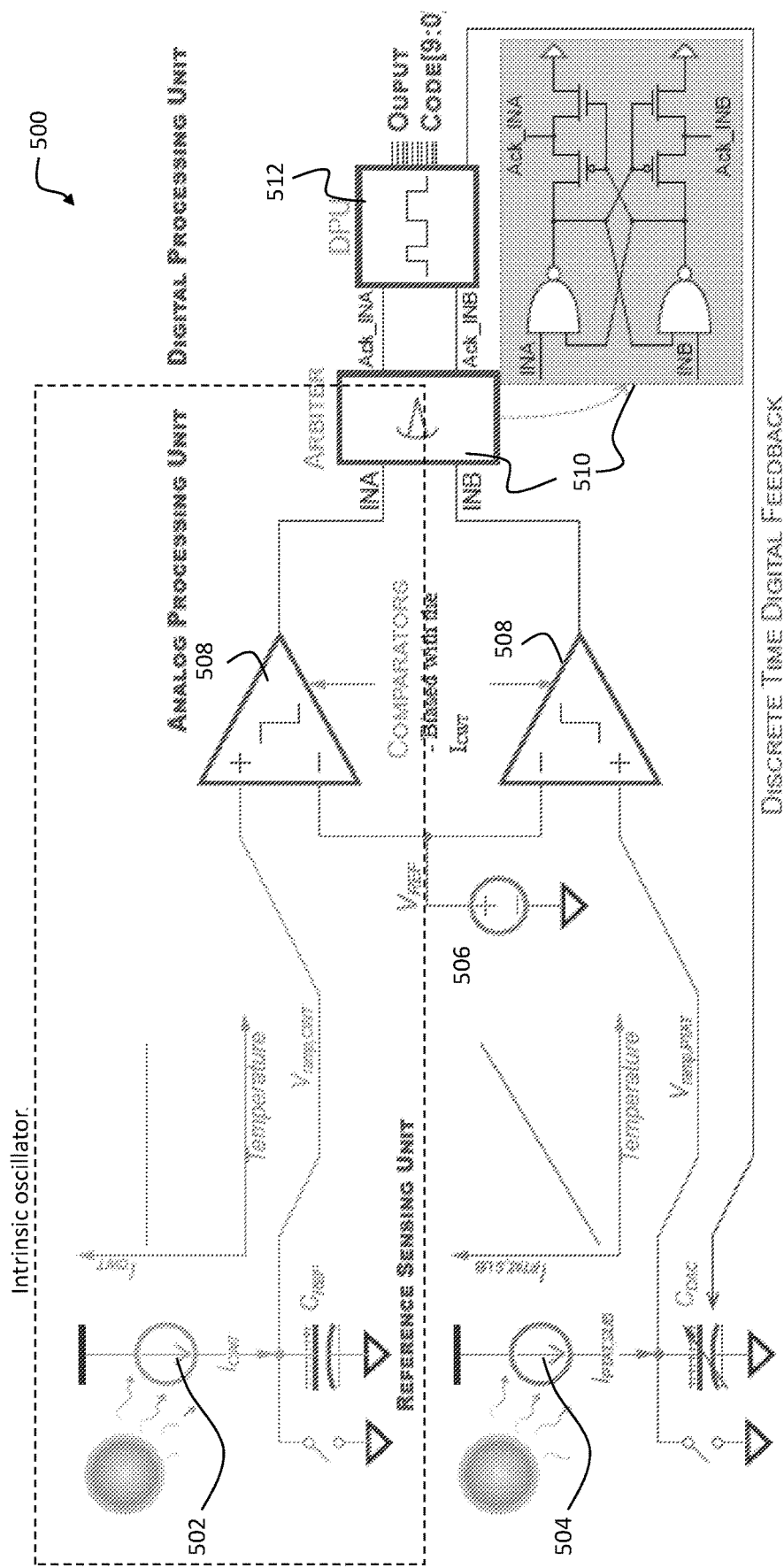
FIG. 5A illustrates is a schematic circuit diagram of another preferred embodiment temperature sensor including a preferred voltage to charging time converter sub-circuit.

FIG. 5A illustrates another preferred embodiment temperature sensor 500 that, like the FIGS. 1A-4 embodiments, provides for monolithically integrated converter. FIGS. 1 and 5A differ in the fact that in FIG. 1, the two ramp voltages $V_{ramp,top}$ and $V_{ramp,bot}$ are generated by the same current source and they do not carry any temperature information. The temperature information is sensed by the $V_{PTAT}$ generator (110) while Vcwt provides a reference. The sensed temperature information (by 110) is then encoded into a charging time by comparing $V_{PTAT}$ to $V_{ramp,bot}$, while a reference charging time is achieved by comparing $V_{CWT}$ to $V_{ramp,top}$, which is then digitized by the following logic. On the other hand, the temperature information is directly sensed and encoded into a charging time and then compared to a reference voltage for digitization purpose in FIG. 5A. Both FIGS. 1 and 5A to sense and encode the temperature into a charging time to enable low-power digitization.

A temperature-stable current source 502 generate a temperature-stable ramp voltage $V_{ramp,CWT}$ by charging a capacitor $C_{REF}$. A PTAT current source 504 converts temperature to a corresponding current and generated a PTAT ramp voltage $V_{ramp,PTAT}$ by charging a digitally-controllable bank of capacitors designed as $C_{DAC}$. An analog processing unit includes a temperature-stabilized VRG 506 (2T details shown as 602 in FIG. 6), comparators 508, and an arbiter 510 (with schematic shown) that together translate the temperature-encoded analog voltages to digital signals in a manner that is analogous to the integrated sensor 100 of FIG. 1A. A digital processing unit DPU 512 processes the information, controls $C_{DAC}$, and generates the digital codes corresponding to the ambient temperature.

Figure 5B:
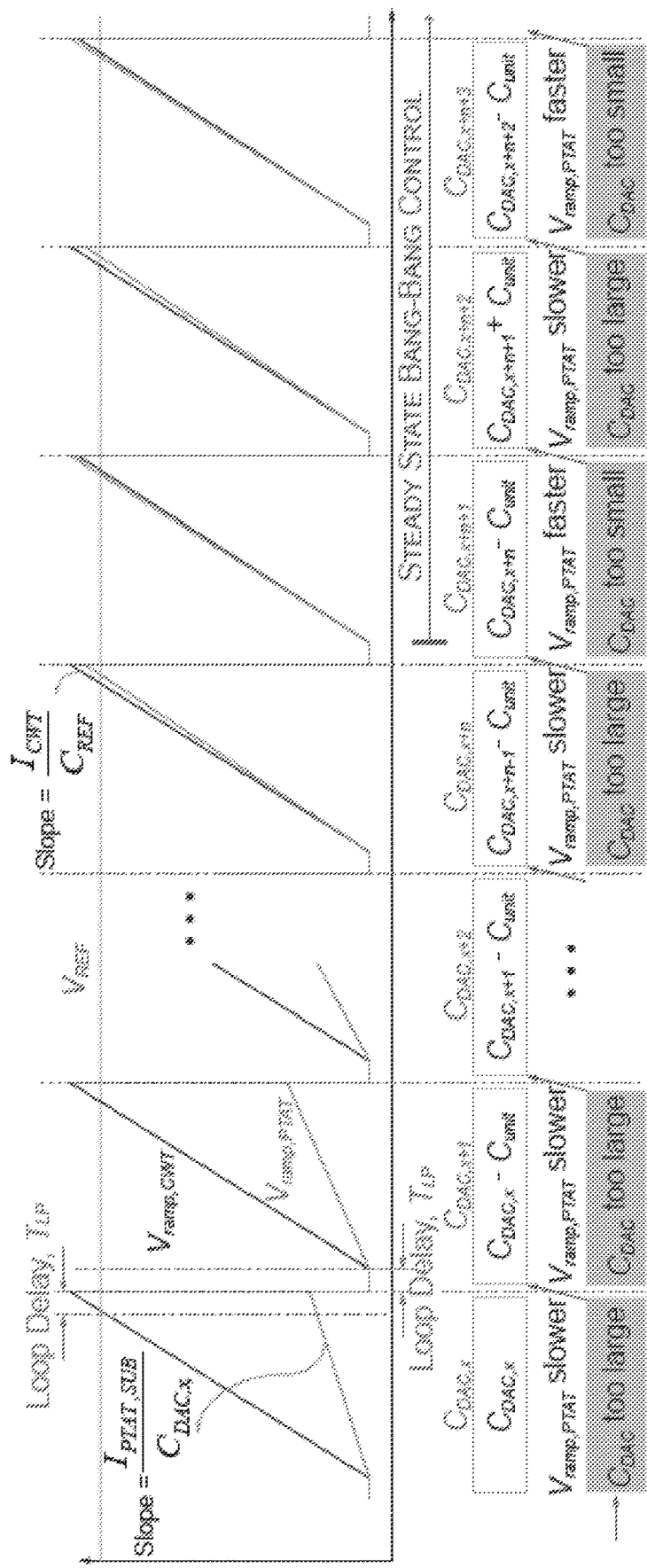
FIG. 5B illustrates a digital processing unit example operation that demonstrates tuning via discrete time digital feedback.

FIG. 5B illustrates an example operation of the DPU showing $C_{DAC}$ being tuned via discrete time digital feedback to match the rising time of $V_{ramp,CWT}$ that is generated by charging a capacitor $C_{REF}$ with the temperature-stable current source 502. An example operation shown in FIG. 5B illustrates that if during one clock cycle $V_{ramp,PTAT}$ rises slower than $V_{ramp,CWT}$, the DAC capacitors that connects to $I_{PTAT,SUB}$, $C_{DAC,x}$ is too large and will be decreased by one unit DAC capacitor $C_{unit}$ in the following clock cycle via the discrete time digital feedback, until the rising time of $V_{ramp,PTAT}$ eventually matches $V_{ramp,CWT}$.

Figure 6:
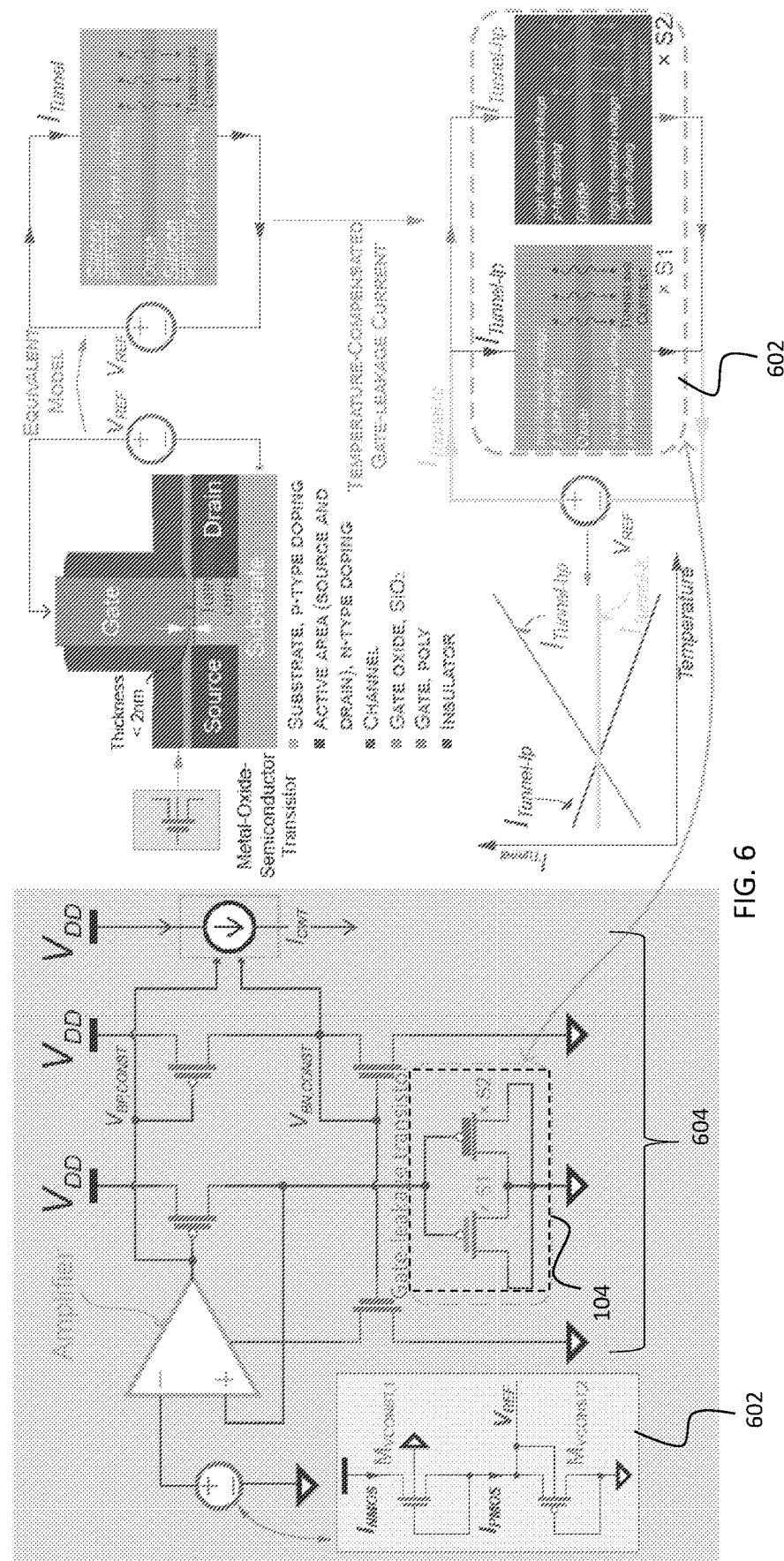
FIG. 6 illustrates preferred embodiment two transistor (2T) voltage and current reference generators.

Preferred reference generators for the FIG. 5A sensor 500 are illustrated in FIG. 6, and the reference generators achieve subthreshold operation and gate-leakage in temperature-stabilized voltage and current reference generators in 65 nm CMOS technology. A temperature-stabilized 2T pW VRG 602 operates in the saturated subthreshold region. The CWT reference current generator 602 uses tunneling current in thin-gate CMOS transistors and temperature-compensated gate-leakage current to achieve pA-level CWT current. A monolithic implementation of the pA-level CWT current reference generator is shown on the right side of FIG. 6. Preferred current reference generators are described in Mercier et al. WO 2017/201353.

The CWT voltage reference circuit 602 can consist of only two conventional n- and p-type MOSFETs (NMOS and PMOS) in a two transistor (2T) push-pull arrangement, as shown in FIG. 6. When biased in the subthreshold or weak-inversion regime (i.e., $|V_{gs}|<V_{th}|$ where $V_{gs}$ is the gate to source voltage and $V_{th}$ is the threshold voltage of the transistors), the drain current of each transistor is given by:

$$I_{sub} = \mu C_{ox} \frac{W}{L}(n-1)\phi_T^2 e^{\frac{V_{gs}-V_{th}}{n\phi_T}}\left(1 - e^{\frac{-V_{ds}}{\phi_T}}\right) \quad (3)$$

where $\mu$ is mobility, $C_{ox}$ is oxide capacitance, W and L are the transistor width and length, respectively, n is subthreshold slope factor, $\phi_T$ is thermal voltage, and $V_{ds}$ is the drain to source voltage. In saturated subthreshold region where $V_{ds}>4\phi_T$, the drain current of the transistor can be calculated by (4):

$$I_{sub} = \mu C_{ox} \frac{W}{L}(n-1)\phi_T^2 e^{\frac{V_{gs}-V_{th}}{n\phi_T}} \quad (4)$$

By equating currents between the NMOS and PMOS, the output reference voltage can be computed, and its temperature sensitivity can be, to a first order, zeroed by appropriate sizing Prior reference generators require zero-threshold transistors to achieve performance of the present generators, but the preferred circuit utilized only conventionally-available MOSFETs and was thus implemented at low cost with no additional mask sets required. Implemented in 65 nm CMOS, the VRG generated $V_{REF}$=345 mV with 260.8 ppm/° C. measured variation from −20 to 60° C. and power varying from 0.1 pW (−20° C.) to 7 pW (60° C.) over the same temperature range. A similar 2T arrangement, though in this case utilizing two NMOS transistors, was employed to generate a PTAT voltage reference. The 2T PTAT VRG generated a PTAT reference, $V_{REF,PTAT}$, with a temperature coefficient of 0.76 mV/° C. over the temperature range from −20 to 60° C. The measured power varied from 0.1 pW (−20° C.) to 62.9 pW (60° C.) over the same temperature range.

While temperature could be transduced by amplifying the difference between the CWT and PTAT VRGs and digitizing with a voltage-mode ADC, the power overhead of doing so would be large. Instead, the FIG. 5A sensor 500 utilizes these voltage references to build ultra-low-power current references, whose outputs can be more easily digitized using a charging-time-to-digital feedback approach. Generation of current sources from voltage references typically relies on applying the voltage reference across a CWT resistance via an analog feedback network. However, the pA current levels use TΩ resistors given the low VRG voltage levels, which are not conventionally possible to implement on- or off-chip in a small area.

Fortunately, it is possible to generate effectively large resistors in a small on-chip area by exploiting tunneling currents through thin gate oxides available in many modern CMOS processes. For example, the 2 nm $SiO_2$ thickness in 65 nm technology facilitates electron tunneling from the conduction band and valence band, and hole tunneling from the valence band, to the point where such gate conduction becomes non-negligible. This tunneling current is a function of process parameters (gate oxide thickness and effective mass, barrier height, etc.) and direct current (DC) bias condition. Transistors doped differently to support, for example, differing threshold voltages, can have opposite temperature coefficients that can be exploited to design CWT tunneling currents. For example, the tunneling current of low threshold (LVT) and standard threshold (SVT) PMOS transistors show opposite temperature dependences. Therefore, the temperature dependence of the gate-leakage current can be minimized by placing appropriately sized LVT and SVT PMOS transistors in parallel with a size ratio of 11:1 and biasing them with a temperature-stabilized reference voltage $V_{REF}$, therefore enabling temperature-stable pA-level current generation.

In FIG. 6, the monolithically-integrated CWT current reference generator 604 is uses a self-biased ultra-low-power operational amplifier [Wang, H. & Mercier, P. P. A 14.5 pW, 31 ppm/° C. resistor-less 5 pA current reference employing a self-regulated push-pull voltage reference generator. in 2016 *IEEE International Symposium on Circuits and Systems* 1290-1293; doi: 10.1109/ISCAS.2016.7527484 (2016)] to provide the feedback path. The total measured power consumption of the CWT current generator was measured to be 3.2 pW. Using a similar topology, a PTAT current generator was implemented employing a 2T PTAT VRG, and consumed 5.8 pW during operation.

With reference again to FIGS. 5A and 5B, the CWT current reference, $I_{CWT}$, charges capacitor $C_{CONST}$, generating a ramp voltage $V_{CONST}$, which serves as the Reference Sensing Unit (RSU). The capacitor is purged (reset) once $V_{CONST}$ reaches $V_{REF}$, a temperature-stabilized voltage reference, thus generating an intrinsic temperature-stabilized oscillator. The period of the intrinsic oscillator is:

$$T_{OSC} = \frac{V_{REF} C_{CONST}}{I_{CWT}} + T_{LP} \quad (5)$$

where $T_{LP}$ is the delay of the loop. At the same time, in the Temperature to Current Conversion Unit (TCCU) shown in 5A, a PTAT current reference, $I_{PTAT,SUB}$, charges a binary-weighted MIM capacitor, $C_{PTAT}$, generating another ramp voltage, $V_{PTAT}$. The temperature-encoded voltages are then conditioned by the Analog Processing Unit (APU) where and the arbiter 510 determines which of the two ramp voltages crossed $V_{REF}$ first. The arbiter output is then used as the input of the Digital Processing Unit DPU 512 to determine if $C_{PTAT}$ should be incremented or decremented to match the charging time of $V_{CONST}$ in the RSU, rendering a 10 bit output code proportional to temperature via discrete time digital feedback control.

The current from the PTAT reference is given by $I_{PTAT}=kT+I_o$, where k is the temperature coefficient, T is the absolute temperature, and $I_o$ represents an offset. Therefore, at steady state:

$$\frac{I_{CWT}}{C_{CONST}} = \frac{I_{PTAT}}{C_{PTAT}} = \frac{kT+I_o}{C_{PTAT}}. \quad (6)$$

Across the temperature range from $T_{min}$ to $T_{max}$, the minimum and maximum required $C_{PTAT}$ can be calculated by (7) and (8), respectively:

$$C_{min} = (kT_{min} + I_o)\frac{C_{CONST}}{I_{CWT}}, \quad (7)$$

$$C_{max} = (kT_{max} + I_o)\frac{C_{CONST}}{I_{CWT}}. \quad (8)$$

The temperature-to-digital conversion resolution $T_{LSB}$, therefore, can be calculated by:

$$T_{LSB} = \frac{T_{max} - T_{min}}{C_{max} - C_{min}} = \frac{1}{k}\frac{I_{CWT}}{C_{CONST}} \quad (9)$$

Figure 7:
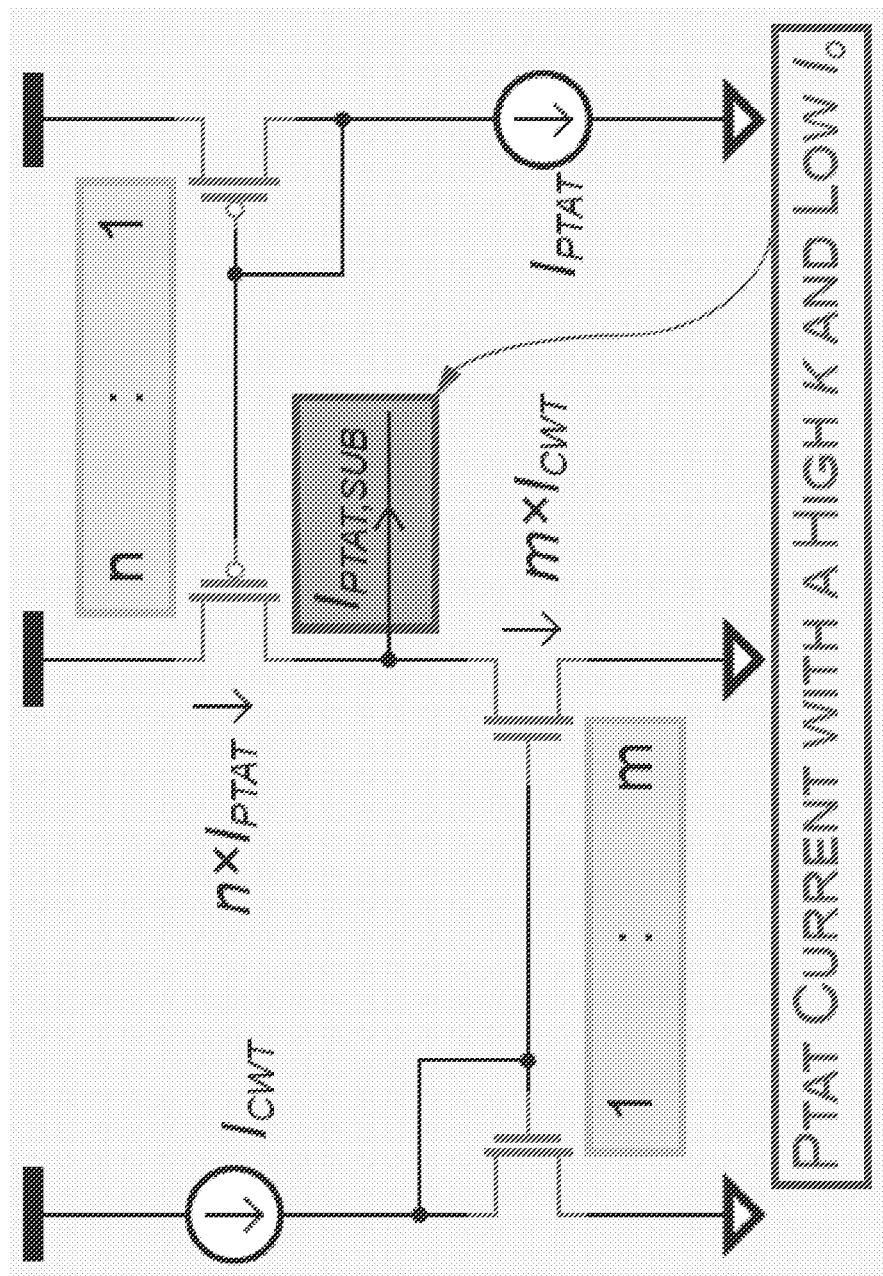
FIG. 7 illustrates a current subtractor that can be employed to increase temperature conversion resolution by increasing the effective temperature coefficient k, where m=1 and n=3.

As shown in (7) and (8), the area of the capacitor $C_{PTAT}$ (which can dominate the chip size) is proportional to $I_o$, while (9) indicates that the achievable temperature-to-digital conversion resolution is inversely proportional to k. To achieve a large resolution in small area, a current subtractor can employed, and is shown in FIG. 7, whereby $n \times I_{PTAT}$ is subtracted from $m \times I_{CWT}$ to generate $I_{PTAT,SUB}$, effectively multiplying the temperature coefficient (and therefore resolution) by n (n=3 in this implementation and is trimmable), while reducing the required capacitor $C_{PTAT}$ area by a factor of $n - m \times I_{CWT}/I_o$ (2.2 in this implementation).

The preferred sensor of FIGS. 5A-7 was fabricated in a standard 65 nm CMOS, and occupied 0.15 mm² The intrinsic oscillator alone occupied an area of 0.038 mm², and oscillated at 0.208 Hz and consumed 11.8 pW at 20° C. The oscillator achieved a temperature accuracy of 772 ppm/° C. and a voltage accuracy of 6%/V).

Four samples of the temperature sensor were tested in a temperature-controlled oven. At 0.5 V, the temperature sensor output codes were measured to be stable across the temperature range. The accuracy of temperature sensing was measured by ramping ambient air temperature at a rate of 0.2° C./minute from −20 to 40° C., and comparing the digital sensor output to the readings of a proximal platinum resistance thermometer. The temperature sensors achieved a minimum inaccuracy of ±1.4° C. and a maximum inaccuracy of ±1.83° C. after a second order calibration. The measured temperature sensing resolution was measured to be 0.21° C. at 20° C.

At 0.5 V, the four temperature sensor samples consumed 113 pW at 20° C. (including the fully-on chip RSU, APU, and DPU), which improves state-of-the-art by 628×. The power of the DPU, which consists of digital control logic, counters, level shifters, etc., dominates the system-level power consumption. The 4.8 s conversion time yields an energy efficiency of 540 pJ/conversion, which is >4× lower than prior fully-integrated temperature sensors (including the power of all reference generators). It should be noted that while prior-art designs can in principle be duty-cycled to achieve low average power given similar energy efficiency metrics, the power of always-on reference generators and oscillators are difficult to scale, and power gating transistors have finite on resistance and off currents, limiting the ability to simply scale prior-art architectures down to sub-nW levels without significant re-design efforts.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A charging to digital converter sensor in a CMOS integrated circuit, the sensor comprising:
    a sensor responding to a sensed property;
    a converter that converts the sensed property into a charging time;
    a digitizer for digitizing the charging time; and
    digital feedback to reset the converter to restart the charging time.

2. The sensor of claim 1, wherein:
    a proportional to sensed property ramp voltage generator that generates a first ramp voltage with a rise time related to the sensed property;
    a second ramp voltage generator that generates a second ramp voltage with a reference rise time;
    the converter and digitizer comprise comparison circuitry to evaluate rise times of the first and second ramp voltages and provide a digital signal that translates the relationship of the first ramp voltage and the reference voltage to a digital quantification of the sensed property; and
    the digital feedback resets the first and second ramp voltage generators.

3. The sensor of claim 2, wherein the first ramp voltage generator comprises a sensed property ramp voltage generator.

4. The sensor of claim 3, wherein the sensed property ramp voltage generator comprises a digitally-controllable bank of capacitors.

5. The sensor of claim 3, wherein the second ramp voltage generator comprises a constant reference ramp voltage generator.

6. The sensor of claim 3, wherein the constant reference ramp voltage generator comprises a constant capacitance.

7. The sensor of claim 2, wherein the comparison circuitry comprises an analog processing unit including comparators and an arbiter that translates encoded analog voltages to digital signals and a digital processing unit that provides an output code in response to the digital signals and the digital feedback to reset the sensed property ramp voltage generator and the constant reference ramp voltage generator.

8. The sensor of claim 5, wherein the sensed property comprises temperature, and the sensed property ramp voltage generator comprises a digitally-controllable bank of capacitors;
    the comparison circuitry comprises comparators, and an arbiter that translates a relationship of the ramp voltages and a reference voltage to digital signals; and a digital processing unit that processes the information the translates the digital signals to a digital output code and generates the digital feedback to reset the sensed property ramp voltage generator and the constant reference ramp voltage generator.

9. The sensor of claim 5, wherein the digital processing unit generates the digital feedback to reset the sensed property ramp voltage generator and the constant reference ramp voltage generator when the second ramp voltage equals a reference voltage.

10. The sensor of claim 4, wherein:
    the sensed property ramp voltage generator comprises a 2-transistor (2T) subthreshold voltage reference generator;
    the constant ramp reference generator comprises a temperature-stabilized 2T subthreshold voltage reference generator.

11. The sensor of claim 2, wherein the converter comprises
a first reference ramp voltage generator that comprises a fixed capacitor and generates a first reference ramp voltage;
a second reference ramp voltage generator that comprises a capacitive digital to analog converter and generates a second reference ramp voltage; and
the comparison circuitry compares the first reference ramp voltage to a proportional with sensed property voltage and the second reference ramp voltage to a constant with temperature voltage.

12. The sensor of claim 1, wherein the sensed property is temperature.

13. The sensor of claim 11, wherein sensed property-dependent current source non-linearities appear as common-mode and are rejected by the comparison circuitry.

14. The sensor of claim 11, wherein the comparison circuitry comprises digital conditioner and an arbiter, wherein the arbiter determines which of the a proportional to sensed property ramp and second ramp voltages crossed its respective ramp voltage threshold first, at which point the digital feedback resets the first and second reference ramp voltage generators.

15. The sensor of claim 14, wherein the comparison circuitry comprises a least significant bit first (LSB-first) digital processing unit that digitally adjusts the second ramp voltage until the charging times are equalized in subsequent cycles.

16. The sensor of claim 15, wherein the charging times are equalized in subsequent cycles when the capacitive digital to analog converter ($C_{top}$) can be calculated by Eq 1:

$$C_{top} = \frac{V_{PTAT} I_{REF,top} C_{bot}}{V_{CWT} I_{REF,bot}}, \quad (1)$$

where IREF,top and IREF,bot are currents mirrored from pA-level current reference generator to charge Ctop and Cbot, respectively, where Cbot is the fixed capacitor.

17. The sensor of claim 11, wherein the thresholds are generated by 3T self-regulated transistor circuits.

18. The sensor of claim 1, consisting of sub pico amp circuit elements and dynamic threshold MOS transistors (DTMOS) with cutoff control.

19. A method for charging to digital converter sensing in a CMOS integrated circuit, the method comprising:
comparing voltage of a proportional to sensed property voltage reference generator to a first ramp voltage generated by charging a capacitance with a mirrored constant with sensed property reference current; and
matching the rising time of the first ramp voltage to a second ramp voltage generated by a reference current mirrored from a common current generator via the tuning of DAC capacitors driven by an LSB-first SAR logic feedback; or matching rising times of the first and second ramp voltages to a reference voltage and providing a digital signal that translates the relationship of the first ramp voltage and the reference voltage to a digital quantification of the sensed property.

* * * * *